United States Patent
Chung et al.

(10) Patent No.: US 7,618,561 B2
(45) Date of Patent: Nov. 17, 2009

(54) ORGANIC SILVER COMPOUND AND IT'S PREPARATION METHOD, ORGANIC SILVER INK AND IT'S DIRECT WIRING METHOD

(75) Inventors: Kwang Choon Chung, Seoul (KR); Myoung Seon Gong, Seoul (KR); Jae Joon Shim, Yongin-si (KR)

(73) Assignee: Haeun Chemtec Co. Ltd. (KR)

( * ) Notice: Subject to any disclaimer, the term of this patent is extended or adjusted under 35 U.S.C. 154(b) by 366 days.

(21) Appl. No.: 10/551,168

(22) PCT Filed: Mar. 26, 2004

(86) PCT No.: PCT/KR2004/000699

§ 371 (c)(1),
(2), (4) Date: Dec. 13, 2006

(87) PCT Pub. No.: WO2004/085165

PCT Pub. Date: Oct. 7, 2004

(65) Prior Publication Data

US 2007/0176150 A1    Aug. 2, 2007

(30) Foreign Application Priority Data

Mar. 28, 2003    (KR) .................... 10-2003-0019724

(51) Int. Cl.
*H01B 1/08*    (2006.01)
*B32B 3/00*    (2006.01)
*C23C 3/02*    (2006.01)

(52) U.S. Cl. .............. 252/519.21; 252/520.3; 423/53; 423/604; 556/110

(58) Field of Classification Search ............. 252/519.2, 252/519.21, 520.3; 423/23, 604; 556/110
See application file for complete search history.

(56) References Cited

U.S. PATENT DOCUMENTS

| | | | |
|---|---|---|---|
| 4,622,069 A | 11/1986 | Akai et al. ................. | 106/1.11 |
| 5,006,170 A | 4/1991 | Schwarz et al. ............... | 106/20 |
| 5,114,744 A | 5/1992 | Cloutier et al. ............... | 427/96 |
| 5,897,694 A | 4/1999 | Woolf ...................... | 106/31.27 |
| 6,265,051 B1 | 7/2001 | Jean .......................... | 428/209 |
| 6,942,825 B2* | 9/2005 | Honda et al. ............. | 252/520.3 |
| 6,965,045 B2* | 11/2005 | Jung et al. ................. | 556/113 |
| 2008/0032062 A1* | 2/2008 | Meiere ...................... | 427/576 |
| 2009/0085015 A1* | 4/2009 | Sato et al. .............. | 252/519.21 |

FOREIGN PATENT DOCUMENTS

| | | |
|---|---|---|
| JP | 10-183207 | 7/1998 |
| JP | 10183207 | 7/1998 |
| KR | 2000-0075549 | 12/2000 |

OTHER PUBLICATIONS

International Search Report; International Application No. PCT/KR2004/000699; Dated: July 16, 2004.
Dispersion and Stability of Silver Inks; B.Y. Tay, M.J. Edirisinghe; Journal of Materials Science 37 (2002) 4653-4661.
Liquid Ink Jet Printing Wiht MOD Inks for Hybrid Microcircuits; K.F. Teng, Robert W. Vest; IEEE and Manufacturing Technology, vol. CHMT-12, No. 4, Dec. 1987.

* cited by examiner

*Primary Examiner*—Mark Kopec
(74) *Attorney, Agent, or Firm*—Cantor Colburn LLP

(57) ABSTRACT

The present invention is to manufacture the organic silver solution by dissolving silver oxide in an organic solvent, and further provide an ink enabling a conductive circuit to be formed by applying it to an inkjet printer. Also, it is to provide a method for forming a conductive circuit on various substrates by printing it through the inkjet printer using the manufactured ink and further heat-treating it. The organic silver solution, a composition according to the present invention, can be manufactured by dissolving silver oxide in an amine-based compound and a lactone-based compound (or a lactam-based compound, a carbonate-based compound, a cyclic acid anhydride-based compound) by reacting the former an the latter, and in order to ensure the appropriate liquid fluidity for the inkjet printer, the ink was manufactured by adding an organic solvent, such as alcohol, a surfactant and the like thereto.

17 Claims, No Drawings

ORGANIC SILVER COMPOUND AND IT'S PREPARATION METHOD, ORGANIC SILVER INK AND IT'S DIRECT WIRING METHOD

TECHNICAL FIELD

The present invention relates to an organic silver solution for forming a conductive circuit, a method for manufacturing it, an ink manufactured from it and a method for forming a conductive circuit using the ink. More particularly, the present invention is to manufacture an organic silver solution by dissolving silver oxide in an organic solvent, further manufacture an ink from it and provide the ink enabling a conductive circuit to be formed by applying it to an inkjet printer. Further, the present invention is to provide a method for forming a conductive circuit on various substrates by conducting a printing work with the manufactured ink through an inkjet printer and treating it thermally.

BACKGROUND ART

Conventional methods for forming a conductive circuit include mainly an etching method, a screen printing method, a vacuum deposition method, a spin coating method and the like. As a substrate, various materials such as glass, epoxy, polyimide and silicon wafer are used depending on the use thereof.

The etching method is to cover a substrate with a conductive film and further form a conductive circuit by using a photo engraving method for leaving only the required conduit circuit of the conductive film by removing the other unnecessary portion of the conductive film than the circuit portion thereof by dissolving it in an etching solution.

The screen printing method is to form a conductive circuit by printing a pattern on the substrate with a conductive metal paste.

The vacuum deposition method is to form a conductive circuit on a wanted position of the substrate by mounting a mask on the substrate and vacuum-depositing a conductive metal thereon.

Currently, the above mentioned methods are widely used, but they are facing such problems as a complicated process, a relatively long process time, a loss of raw materials, a low yield rate, a high cost and an environmental problem. Particularly, they may cause a serious environmental problem in the course of disposing an etching solution, a washing solution, a photosensitive film and the like. A recent tendency is to exclude substances causing environmental contamination from raw materials used in the plating process for the reason of an environmental problem resulting from them. Therefore, the fact is that it is very difficult to control the required properties.

Further, electronic apparatus become more and more compact and multi-functional. Electronic components such as a resistor and a condenser mounted on the substrate are also manufactured in a very small size so that they are used as an element of a multi-layer substrate. Accordingly, a wiring circuit of the printing circuit substrate is also required to be highly minute and precise.

Recently, as the above mentioned problems have been raised and a conductive circuit pattern of a printing circuit substrate as required by the industry has got to be extremely various and complicated, many studies on development of a method for forming a circuit pattern by using an inkjet printer are being conducted.

The method for forming a conductive circuit by using an inkjet printer is to form a conductive circuit by discharging a conductive ink onto the substrate from the head of the inkjet printer according to a pattern designed by a computer system.

The method for forming a conductive circuit by using an inkjet printer can solve all the said problems and further has an advantage that a circuit can be easily designed thanks to rapid advancement of computer systems and peripheral devices thereof. In addition, it enables various types of products required by end-users to be manufactured in a small quantity and supplied to end-users at a low cost so that it can provide a method for lowering prices of expensive electronic products.

Despite the said advantages, a method for forming a conductive circuit by using an inkjet has not been widely used yet. The reason for this situation resides in the conductive ink. The conductive ink should meet largely two requirements. Firstly, it should have an electrical property, that is to say, the required conductibility, and its adhesive property to the substrate should be good. Secondly, it should satisfy properties of the ink enabling an inkjet printing work to be performed, e.g., viscosity, surface tension, stability and the like.

In order to meet the said requirements, various methods have been being studied.

U.S. Pat. No. 5,114,744 discloses a method for forming a conductive circuit. The ink composition used by this method includes stickers, additives and one or more solvents. The ink is transferred into the selected pattern by a continuous type of inkjet system. Subsequently, the metal powder gets to adhere to the substrate by stickers according to the pattern and any excessive metal powder is removed. And, a circuit pattern is formed by heating the substrate, pattern and metal powder at a temperature enough to dissolve the metal powder. The ink provided by this invention is not a conductive ink, but an adhesive ink. This invention is of a method for making a pattern of the adhesive ink on the substrate, jetting the metal powder onto it, removing the metal powder distributed outside the pattern, and melting the metal powder on the pattern by heating it. This invention is not suitable for the inkjet system because the viscosity of stickers of the adhesive ink enabling the metal powder to adhere to the pattern is high. Moreover, it has a disadvantage that because it should be treated at a high temperature enabling the metal powder to be molten, a substrate material should be also selected from materials stable at a high temperature.

More importance has been recently being attached to the usability of a universal substrate material in selection of a substrate material. For example, this is because in the case that a circuit board for an automation device, a camcorder and the like has to be movable with it being bent and in the case that the circuit board has to be bent when a component is inserted into it and a component is configured on it, a flexible PCB should be used as a substrate that can meet the requirements for such cases, that is to say, a suitable circuit substrate should be selected depending upon the used apparatus.

Such substrate materials include typically a polymer film material such as polyimide or polyester.

However, in the case of such polymer film, the process temperature range is limited because decomposition of polymer and deviation of a dimension may occur when it is baked at high temperature.

Also, Japanese Laid-open Patent Publication No. (Hei) 10-183207 describes an ink for inkjet printing in the form of an independent dispersed liquid of metal ultrafine particles which enables an electrode of a flat panel display (FPO) to be formed.

This patent publication introduced a technology for capturing silver fine powder into the solution by using the gas atmosphere phase evaporation method in order to manufacture fine powder, then obtaining a dispersed liquid of metal fine particles, then manufacturing an ink which can be jetted, and thereby forming a conductive circuit. However, this method requires extra devices for electronic beam plasma or laser induced heat so that it takes a high cost. Moreover, in the case of using such metal fine particles, it is very difficult to disperse them independently in the solvent so that it is difficult to maintain a high concentration of metal colloid phase. As a result, stability including preservative quality is not sufficient. Also, since a production amount of metal ultrafine particles is small, it is not easy to produce them on a large scale so that its use cannot avoid being limited to some special uses.

In addition, studies on manufacture of a metal paste and a conductive ink for forming a conductive circuit by using organic metal compounds have been recently being actively conducted.

For example, a method for forming a conductive circuit by using an organic silver solution and an inkjet printer was introduced in the reference literature titled Liquid Ink Jet Printing with MOD Inks for Hybrid Microcircuits (Teng, K. F., and Vest, R. W., IEEE Transactions on Components, Hybrids and Manufacturing Technology, 12(4), 545-549, 1987). However, it is pointed out that the solid matter thereof is small so that the coated film is very thin and the required conductibility fails to be obtained.

Korean Laid-open Patent Publication No. 2000-75549 discloses a method for forming a conductive film and a conductive circuit by baking a mixture of metal powder with an organic metal compound at a low temperature (300~350° C.) by using a screen printing method. However, in the case that the conductive ink is manufactured by mixing such organic metal compound with the metal powder, a process that the metal powder should be dispersed is included, and it has a disadvantage that the viscosity should be lowered to enable the ink to be jetted.

This disadvantage is pointed out in the reference literature titled "Dispersion and Stability of Silver Ink" (B. Y. Tat. M. J. Edirisinghe, 2002), which mentions a conductive ink as manufactured by using three kinds of dispersing agents to disperse it stably.

In addition, there are a considerable number of related literatures, but all of them say that the ink should be manufacture through a dispersing process. For manufacturing an ink containing metal fine powder, it is a key point to make a stabilized colloid. However, it is very difficult to obtain a stabilized colloid, and in order to obtain it, a special dispersing process, that is to say, a milling process is required. Through this dispersing process, it is very difficult to obtain a constant result every time the work is conducted. If the work for maintaining an average particle size below a given level and adjusting all physical properties correctly meeting is not performed properly, particles with a great average particle diameter clogs a nozzle of the inkjet head to cause defective printing so that it gets to be impossible to form a conductive circuit continuously.

DISCLOSURE OF THE INVENTION

In order to solve the said problems, the present invention is to manufacture an organic silver composition solution for forming a conductive circuit through a simple process at a low manufacturing cost, and provide a stabilized ink manufactured from this solution and further a method for forming a conductive circuit with this ink by using an inkjet printer.

The present inventors have discovered the following facts in the process to manufacture organic silver from silver oxide in order to manufacture a stabilized ink that can be economically produced for eliminating the disadvantage of the conventional dispersing methods as explained above.

The silver oxide is well dissolved in the mixture of an amine-based compound with a lactone-based compound. It is conjectured that this is because the amine-based compound transforms a molecular structure of the lactone-based compound and the transformed compound gets to be combined with the silver ion to form an organic silver composition. The amine-based compound functions to transform the structure of the lactone-based compound and simultaneously dissolve the said organic silver composition.

As a result of conducting experiments repeatedly, it has been discovered that not only the said lactone-based compound but also a lactam-based compound, a carbonate-based compound and a cyclic acid anhydride-based compound function to do the same.

As described above, the organic silver composition solution according to the present invention is composed of silver oxide, an amine-based compound, a lactone-based compound (or a lactam-based compound, a carbonate-based compound, a cyclic acid anhydride-based compound). In order to ensure the liquid fluidity suitable for an inkjet printer, an organic solvent such as alcohol and a surfactant were added thereto. Thereby, a conductive ink was manufactured.

Hereinafter, the organic silver composition according to the present invention, and the conductive ink manufactured from this composition are described.

The organic silver composition solution is composed of 5~40 wt. % of silver oxide, 20~85 wt. % of amine-based compound having the carbon number of 1~12, and 10~20 wt. % of lactone, carbonate and cyclic acid anhydride-based compound alone or the mixture thereof.

In the present invention, the use of silver oxide enables the process where ionic compounds, such as chlorine ion, nitric acid and the like, which are produced as by-products when the organic silver composition solution is manufactured by using silver nitrate or silver chloride, should be removed to be omitted. The content of silver atom per molecular of the said silver oxide is 98% so that the use thereof has a great advantage in manufacturing the organic silver solution.

Amine-based compounds usually refer to compounds containing the amino group. For example, they include linear or branched alkyl amine of which the carbon number is 1~12, cyclic alkyl amine, amino alcohol compound and the like of which the carbon number is 1~8, linear or branched alkyl diamine compound and the like of which the carbon number is 1~12, cyclic alkyl diamine compound and the like of which the carbon number is 1~8, N-methylethylenediamine, N-propylethylenediamine, N,N-dimethylethylenediamine, N-methyl-1,3-propanediamine, N-propyl-1,3-propanediamine, N-isopropyl-1,3-propanediamine, diethylenetriamine, N-dimethylethylenediamine, 3-methoxypropylamine and the like, but not limited to them, and any compound within the scope of identity that can be used by anyone having a common knowledge in the same industrial field maybe selected. Among these compounds, any compound of a single component may be used, or any compound selected from the group consisting of a mixture of two or more compounds may be used.

When any amine-based compound is selected, anyone that can be easily desorbed when it is coated with the organic silver solution and it is heat-treated is suitable. Wherein, the boiling point of −10~200° C. is suitable, preferably the boiling point of 10~120° C. and more preferably the boiling point of 40~100° C. is suitable.

Lactone-based compounds include β-propiolactone, γ-propiolactone, γ-butyrolactone, γ-thiobutyrolactone, α-methyl-γ-butyrolactone, β-methyl-γ-butyrolactone, γ-valerolactone, γ-caprolactone, γ-octanoiclactone, δ-valerolactone, 1,6-dioxaspiro[4,4]nonane-2,7-dione, α-methylene-γ-butyrolactone, γ-methylene-γ-butyrolactone, ϵ-caprolactone, lactide, glycolide, tetronic acid, 2(5H)-hyuranone, β-hydroxy-γ-butyrolactone, mevalonic lactone, 5,6-dihydro-2H-pyran-2-one, δ-valerolactone, ϵ-caprolactone, γ-caprolactone, γ-octanoic lactone and the like.

Lactam-based compounds include 2-azethidone, 2-pyrolidinone, 5-methoxy-2-pyrolidinone, 5-methyl-2-pyrolidinoe, N-methylpyrolidinone, N-cyclohexylpyrolidinone, 1-vinyl-2-pyrolidinone, ϵ-caprolactam, 2-azacyclolactone, N-methylcaprolactam, 2-azacyclononanone, N-acetylcaprolactone and the like.

Carbonate-based compounds include ethylenecarbonate, propylenecarbonate, ethylcarbonate, vinylene carbonate and the like.

Cyclic acid anhydrides include itaconic anhydride, succinic anhydride, maleic anhydride, glutaric anhydride, octadexylsuccinic anhydride, maleic anhydride, glutaric anhydride, octadecylsuccinic anhydride, 2,2-dimethylsuccinic anhydride, 2-dodeken-1-ylsuccinic anhydride, hexafluoroglutaric anhydride, 3,3-dimetylglutaric anhydride, 3-ethyl-3-methyl glutaric anhydride, 3,5-diacetyltetrahydropyran-2,4,6-trione, diglycolic anhydride and the like, but not limited to them, and any compound within the scope of identity that can be used by anyone having a common knowledge in the same industrial field may be selected. Among these compounds, any compound of a single component may be used, or any compound selected from the group consisting of a mixture of two or more compounds may be used.

The silver oxide was dissolved in the mixture of a solvent of a single amine-based compound or a mixture of amine-based compounds with a solvent of a single lactone-based compound (or a lactam-based compound, a carbonate-based compound, a cyclic acid anhydride-based compound) or a mixture of lactone-based compounds. Then, the organic silver composition solution was manufactured by using an ultrasonic disperser to increase the dissolution rate. This organic silver composition solution contains 5~40% of solid matter which is considerably higher than the content of solid matter as obtained by a prior art. Because the content of solid matter of this organic silver composition is high, it can be also used as a metal paste which is used in a screen printing method, a conventional conductive pattern method.

In order to ensure the liquid fluidity suitable for an inkjet printer, a conductive ink is manufactured by adding an organic solvent such as alcohol and a surfactant to a high concentration of the organic silver composition solution as manufactured by the said method.

The conductive organic silver composition according to the present invention may be composed of 10~90 wt. %, preferably 30~90 wt. % and more preferably 50~80 wt. % of the organic silver composition solution, 9.9~85 wt. %, preferably 9.8~70 wt. % and more preferably 19.5~50 wt. % of the organic solvent having compatibility therewith, and 0.1~10 wt. %, preferably 0.2~10 wt. % and more preferably 0.5~5 wt. % of the nonionic surfactant and the ionic surfactant.

Wherein, as a solvent, a single polar solvent or a mixture of two or more kinds of polar solvents having a boiling point of 50~300° C., preferably 150~300° C. and more preferably 200~250° C. may be used.

In the case that the boiling point of the solvent is lower than 10 0° C., a phenomenon that the inkjet head nozzle gels to be clogged may occur, and cracking and roughness of the surface may appear after a conductive film and a conductive circuit are formed.

Also, the amount of the solvent is used for adjusting the viscosity thereof, and it can be adjusted in consideration of the thickness of the conductive film, the size of the inkjet head nozzle and the like. Wherein, 2~100 cps, preferably 2~50 cps and more preferably 2~25 cps of the viscosity thereof is available.

And, the surfactant is not limited to either of the ionic surfactant or the nonionic surfactant, and a single surfactant or a mixture of two or more kinds of surfactants may be used. It is used for adjusting the surface tension of the substrate surface, that is to say, the wetting characteristic of the ink to the substrate. Usually, it is preferable to adjust the surface tension to 32~50 dyne/cm.

In the case that the surface tension is lower than 32 dyne/cm, the ink spreads too rapidly on the substrate after it is jetted onto the substrate so that it is not possible to maintain the required resolution. On the other hand, in the case that the surface tension is higher than 50 dyne/cm, the ink to be jetted from the nozzle does not get to be jetted as much as it is required so that a sufficient thickness of the conductive film cannot be obtained.

A method for forming a conductive film and a conductive circuit includes a piezo method for jetting ink bubbles through vibrations by a piezoelectric sensor and a thermal method and a bubble jet method for generating bubbles internally by using heat and then push out ink bubbles. However, in the case that the ink is jetted by using heat, it may cause molecules of the organic silver to be decomposed, and as a result, the nozzle may get to be clogged or the stability of the liquid may be deteriorated.

In the present invention, it is preferable to use a piezo type of inkjet nozzle. It is more preferable to use an inkjet printer enabling the frequency, the temperature of the ink reservoir, the nozzle size and the temperature of the applicable substrate to be adjusted or controlled.

The conductive film and the conductive circuit formed by using the inkjet method as described above get to obtain the final conductibility through heat treatment thereof, and apparent characteristic, adhesiveness and conductibility of the conductive film are determined depending on the heat treatment condition.

Usually, the heat treatment can be done for 10~30 minutes at 100~150° C. and continuously for 10~30 minutes at 200~300° C. Wherein, an improvement in the baking time, the characteristic of the conductive film and the characteristic of the conductivity can be sought by doing the heat treatment in the atmosphere of a single gas or a mixed gas of nitrogen, argon, hydrogen and the like.

The obtained conductibility of the conductive film and the conductive circuit as manufactured according to the present invention is $9.8 \times 10^{-6}$~$6.9 \times 10^{-5}$, which represents the excellent conductibility of the conductive circuit.

BEST MODE FOR CARRYING OUT THE INVENTION

Hereinafter, the present invention is described in more details by referring to examples and comparative examples. However, the present invention is not limited to the following examples.

EXAMPLE 1

40 g of silver oxide (I) was put into 100 g of 60 wt. % of ethylamine (aqueous solution) as contained in a flask with a round bottom where a condenser was installed. Then, as it was dispersed by using ultrasonic waves, it was agitated for 30 minutes with it being maintained at 10° C. A mixed solution of 30 g of γ-butyrolactone with 30 g of methylethylketone was continuously dropped into the said solution at a rate of 5 ml/min, and then it was continuously refluxed for 40 minutes with the container being maintained at 95~100° C. Thereby, the silver oxide was dissolved therein. The reaction mixture was distilled under reduced pressure at 10° C. to remove excessive ethylanine. Thereby, an organic silver composition solution was manufactured. With the final solid matter obtained in this process, 36.5% of pale green organic silver composition solution could be obtained.

EXAMPLE 2

40 g of silver oxide (I) was put into 100 g of 70 wt. % of isopropyl amine (aqueous solution) as contained in a flask with a round bottom where a condenser was installed. Then, as it was dispersed by using ultrasonic waves, it was agitated for 30 minutes with it being maintained at 10° C. A mixed solution of 30 g of γ-butyrolactone with 40 g of methylethylketone was continuously dropped into the said solution at a rate of 5 ml/min, and then it was continuously refluxed for 40 minutes with the container being maintained at 95~100° C. Thereby, the silver oxide was dissolved therein. The reaction mixture was distilled under reduced pressure at 10° C. to remove excessive isopropyl amine. Thereby, an organic silver complex solution was manufactured. With the final solid matter obtained in this process, 33.6% of pale green organic silver solution could be obtained

EXAMPLE 3

40 g of silver oxide (I) was put into 100 g of 70 wt. % of isopropyl amine (aqueous solution) as contained in a flask with a round bottom where a condenser was installed. Then, as it was dispersed by using ultrasonic waves, it was agitated for 30 minutes with it being maintained at 10° C. A mixed solution of 30 g of propylenecarbonate with 40 g of acetonitrile was continuously dropped into the said solution at a rate of 5 ml/min, and then it was continuously refluxed for 40 minutes with the container being maintained at 95~100° C. Thereby, the silver oxide was dissolved therein. The reaction mixture was distilled under reduced pressure at 10° C. to remove excessive isopropyl amine. Thereby, an organic silver complex solution was manufactured. With the final solid matter obtained in this process, 35.6% of pale green organic silver solution could be obtained.

EXAMPLE 4

40 g of silver oxide (I) was put into 100 g of 60 wt. % of benzyl amine (aqueous solution) as contained in a flask with a round bottom where a condenser was installed. Then, as it was dispersed by using ultrasonic waves, it was agitated for 30 minutes with it being maintained at 10° C. A mixed solution of 30 g of ethylene carbonate with 40 g of acetonitrile was continuously dropped into the said solution at a rate of 5 ml/min, and then it was continuously refluxed for 40 minutes with the container being maintained at 95~100° C. Thereby, the silver oxide was dissolved therein. The reaction mixture was distilled under reduced pressure at 35° C. to remove excessive benzyl amine. Thereby, an organic silver complex solution was manufactured. With the final solid matter obtained in this process, 32.0% of earth brown organic silver solution could be obtained.

EXAMPLE 5

40 g of silver oxide (I) was put into 100 g of 60 wt. % of isopropyl amine (aqueous solution) as contained in a flask with a round bottom where a condenser was installed. Then, as it was dispersed by using ultrasonic waves, it was agitated for 30 minutes with it being maintained at 10° C. A mixed solution of 20 g of succinic anhydride with 40 g of methylethylketone was continuously dropped into the said solution at a rate of 5 ml/min, and then it was continuously refluxed for 40 minutes with the container being maintained at 95~100° C. Thereby, the silver oxide was dissolved therein. The reaction mixture was distilled under reduced pressure at 10° C. to remove excessive isopropyl amine. Thereby, an organic silver complex solution was manufactured. With the final solid matter obtained in this process, 29.8% of earth grey organic silver solution could be obtained.

EXAMPLE 6

40 g of silver oxide (I) was put into 100 g of 70 wt. % of ethyl amine (aqueous solution) as contained in a flask with a round bottom where a condenser was installed. Then, as it was dispersed by using ultrasonic waves, it was agitated for 30 minutes with it being maintained at 10° C. A mixed solution of 30 g of ita-caprolactam with 40 g of methylethylketone was continuously dropped into the said solution at a rate of 5 ml/min, and then it was continuously refluxed for 40 minutes with the container being maintained at 95~100° C. Thereby, the silver oxide was dissolved therein. The reaction mixture was distilled under reduced pressure at 10° C. to remove excessive ethyl amine. Thereby, an organic silver complex solution was manufactured. With the final solid matter obtained in this process, 33.6% of earth brown organic silver solution could be obtained.

EXAMPLE 7

An ink for inkjet printing was manufactured by adding 5 g of dimethylsulfoxide, 5 g of isopropyl alcohol and 0.001 g of Sulfinol-465 (brand name manufactured by Air Products) to 15 g of the organic silver solution of Example 1. Wherein, the solid matter content was 22%, the surface tension was 37 dyne/cm and the viscosity was 12 cps.

EXAMPLE 8

An ink for inkjet printing was manufactured by adding 5 g of dimethylsulfoxide, 5 g of isopropyl alcohol and 0.001 g of Sulfinol-465 (brand name; manufactured by Air Products) to 15 g of the organic silver solution of Example 2. Wherein, the solid matter content was 20%, the surface tension was 36 dyne/cm and the viscosity was 10 cps.

EXAMPLE 9

An ink for inkjet printing was manufactured by adding 5 g of succinonitrile, 5 g of isopropyl alcohol and 0.001 g of Sulfinol-465 (brand name; manufactured by Air Products) to 15 g of the organic silver solution of Example 3. Wherein, the solid matter content was 21%, the surface tension was 38 dyne/cm and the viscosity was 10 cps.

EXAMPLE 10

An ink for inkjet printing was manufactured by adding 5 g of N-methylpyrrolidone, 2 g of diaminoethanol and 0.001 g of Sulfinol-465 (brand name; manufactured by Air Products) to 15 g of the organic silver solution of Example 4. wherein, the solid matter content was 19%, the surface tension was 37 dyne/cm and the viscosity was 25 cps.

EXAMPLE 11

An ink for inkjet printing was manufactured by adding 5 g of propionitrile, 2 g of aminomehtanol and 0.001 g 5 wt. % aqueous solution of BYK-346 (brand name; manufactured by BYK) to 15 g of the organic silver solution of Example 5. wherein, the solid matter content was 19%, the surface tension was 33 dyne/cm and the viscosity was 11 cps.

EXAMPLE 12

An ink for inkjet printing was manufactured by adding 5 g of N-methylpyrrolidinone, 1 g of diaminoethanol, 1 g of isopropylalcohol and 0.001 g of Sulfinol-465 (brandname; manufactured by Air Products) to 15 g of the organic silver solution of Example 6. Wherein, the solid matter content was 19%, the surface tension was 35 dyne/cm and the viscosity was 17 cps.

COMPARATIVE EXAMPLE 1

Silver stearate was manufactured by dropping 10 g of silver nitrate (45% aqueous solution) into 30 g of sodium stearate (30% aqueous solution) contained in a flask. Then, sodium nitrate was removed by using a separator, and an organic silver solution with a solid matter content of 3% was manufactured in xylene. Then, an ink for inkjet printing was manufactured by adding 0.03 g of Sulfinol-104H (brand name; manufactured by Air Products) to 50 g of the organic silver solution. Wherein, the surface tension was 35 dyne/cm and the viscosity was 11 cps.

COMPARATIVE EXAMPLE 2

350 g of sodium citrate solution (40% solid matter) and 250 g of ferrous sulfate solution (30% solid matter) were mixed in a flask. Then, as 10% silver nitrate solution was dropped into it, it was agitated at a rate of 4,000 rpm. Thereby, a silver colloid solution was obtained.

Ion was removed by centrifuging the said colloid solution several times in distilled water, and it was dried. Thereby, fine silver powder was obtained. Then, an ink with a solid matter content of 5% for inkjet printing was manufactured by adding 20 g of ethylene glycol, 50 g of distilled water and 0.01 g of Sulfinol-465H (brand name; manufactured by Air Products) to 3.5 g of the silver powder. Wherein, the surface tension was 400 dyne/cm and the viscosity was 8 cps.

EXAMPLE 13

A polyethylene container was filled with each ink of the said Example 7~12 and Comparative Example 1~2. Then, printing of which the line width was 200 μm, the length was 50 mm, the breadth was 10 mm and the height was 10 mm was conducted 3 times on a borosilicate substrate and Kepton (brand name; manufactured by DuPont), a polyimide film, by using a plate printer in which a piezo type of inkjet printer head F076000 (brand name; manufactured by Epson) was installed, and then it was heat treated. Thereby, a final conductive circuit and a conductive film were obtained. Wherein, the heat treatment was conducted at 100° C. for 30 minutes and then, continuously at 250° C. for 30 minutes. Characteristics thereof after heat treatment were shown in details in Table 1 as follows:

TABLE 1

| | Adhesiveness[1] | | Printability[2] | | Conductibility | |
|---|---|---|---|---|---|---|
| | Substrate A[3] | Substrate B[4] | Substrate A | Substrate B | Substrate A | Substrate B |
| Example 7 | Good | Good | Good | Good | $2.8 \times 10^{-4} \Omega$ | $2.1 \times 10^{-4} \Omega$ |
| Example 8 | Good | Good | Good | Good | $2.3 \times 10^{-4} \Omega$ | $1.8 \times 10^{-4} \Omega$ |
| Example 9 | Ordinary | Ordinary | Ordinary | Ordinary | $7.5 \times 10^{-5} \Omega$ | $6.9 \times 10^{-5} \Omega$ |
| Example 10 | Ordinary | Ordinary | Ordinary | Ordinary | $2.5 \times 10^{-4} \Omega$ | $1.9 \times 10^{-4} \Omega$ |
| Example 11 | Good | Good | Ordinary | Ordinary | $3.6 \times 10^{-4} \Omega$ | $2.8 \times 10^{-4} \Omega$ |
| Example 12 | Ordinary | Ordinary | Ordinary | Ordinary | $5.4 \times 10^{-4} \Omega$ | $4.2 \times 10^{-4} \Omega$ |
| Comparative Example 1 | Good | Good | Ordinary | Ordinary | $1.2 \times 10^{-3} \Omega$ | $1.0 \times 10^{-3} \Omega$ |
| Comparative Example 2 | Poor | Poor | Ordinary | Poor | $8.2 \times 10^{-3} \Omega$ | $6.8 \times 10^{-3} \Omega$ |

[1]Evaluation of adhesiveness: A scotch tape (brand name: manufactured by 3M) was attached to the printed surface and then detached from it. Then, the state that the printing was transferred to the scotch tape was evaluated.
Good (nothing was transferred to the tape)
Ordinary (something was transferred to the tape)
Poor (the printing was almost transferred to the tape)
[2]Evaluation of Printability: Characteristics of the surface and spreading of the ink after the drying process at 100° C. for 30 minutes
Good (in the case that there was no apparent problem on the printing surface and the line configuration was clear)
Ordinary (in the case that the spread of the ink got together in parts on the printed surface)
Poor (in the case that the spread of the ink got together to one side on the printed surface and a breakage took place in the line)
[3]Substrate A: borosilicate substrate
[4]Substrate B: polyimide film

EXAMPLE 14

A polyethylene container was filled with each ink of the said Example 7~12 and Comparative Example 1~2. Then, printing of which the line width was 200 μm, the length was 50 mm, the breadth was 100 mm and the height was 100 mm was conducted 3 times on a borosilicate substrate and Kepton (brand name; manufactured by Du Pont), a polyimide film, by using a plate printer in which a piezo type of inkjet printer head F076000 (brand name; manufactured by Epson) was installed, and then it was heat treated. Thereby, a final conductive circuit and a conductive film were obtained. Wherein, the heat treatment was conducted at 100° C. for 30 minutes, then at 150° C. for 15 minutes and then continuously at 300° C. for 30 minutes. Characteristics thereof after heat treatment were shown in details in Table 2 as follows:

TABLE 2

| | Adhesiveness [1] | | Printability [2] | | Conductibility | |
|---|---|---|---|---|---|---|
| | Substrate A [3] | Substrate B [4] | Substrate A | Substrate B | Substrate A | Substrate B |
| Example 7 | Good | Good | Good | Good | $9.9 \times 10^{-6} \Omega$ | $9.1 \times 10^{-6} \Omega$ |
| Example 8 | Good | Good | Good | Good | $9.8 \times 10^{-6} \Omega$ | $9.3 \times 10^{-6} \Omega$ |
| Example 9 | Ordinary | Ordinary | Ordinary | Ordinary | $9.9 \times 10^{-6} \Omega$ | $6.7 \times 10^{-6} \Omega$ |
| Example 10 | Ordinary | Ordinary | Ordinary | Ordinary | $6.8 \times 10^{-5} \Omega$ | $5.9 \times 10^{-5} \Omega$ |
| Example 11 | Good | Good | Ordinary | Ordinary | $7.6 \times 10^{-5} \Omega$ | $7.7 \times 10^{-5} \Omega$ |
| Example 12 | Ordinary | Ordinary | Ordinary | Ordinary | $9.2 \times 10^{-5} \Omega$ | $8.9 \times 10^{-5} \Omega$ |
| Comparative Example 1 | Good | Good | Ordinary | Ordinary | $9.0 \times 10^{-5} \Omega$ | $8.3 \times 10^{-5} \Omega$ |
| Comparative Example 2 | Poor | Poor | Ordinary | Poor | $8.8 \times 10^{-5} \Omega$ | $8.4 \times 10^{-5} \Omega$ |

The contents of [1]Evaluation of Adhesiveness, [2]Printability, [3]Substrate A and [4]Substrate B are the same as in Table 1.

INDUSTRIAL APPLICABILITY

In the light of the above evaluation results, the present invention can provide a method for manufacturing a high concentration of organic silver solution and an ink for inkjet printing through a small number of processes and at a low process cost, and further a technology for forming a conductive film and a conductive circuit giving higher adhesiveness to a substrate, printability and conductibility after inkjet printing and heat treatment than conventional methods.

What is claimed is:

1. An organic silver composition, wherein the composition is manufactured by reacting silver oxide on a mixture of one or more compounds selected from the group consisting of amine-based compounds with one or more compounds selected from the group consisting of organic compounds forming organic silver by reacting on silver oxide, and thereby dissolving it, wherein said organic compounds are selected from the group consisting of lactone-based compounds, lactam-based compounds, and carbonate-based compounds.

2. The organic silver composition according to claim 1, wherein a single organic compound or a mixture of one or more compounds as selected from the group consisting of lactone-based compounds is used.

3. A method for manufacturing an organic silver composition by mixing one or more compounds selected from the group consisting of amine-based compounds with the organic compound according to claim 2, then reacting silver oxide on this mixture and thereby dissolving it.

4. An ink composition, wherein it is composed of the organic silver composition manufactured according to claim 2, an organic solvent and a surfactant.

5. The organic silver composition according to claim 1, wherein a single organic compound or a mixture of one or more compounds as selected from the group consisting of lactam-based compounds is used.

6. An ink composition, wherein it is composed of the organic silver composition manufactured according to claim 5, an organic solvent and a surfactant.

7. A method for manufacturing an organic silver composition by mixing one or more compounds selected from the group consisting of amine-based compounds with the organic compound according to claim 5, then reacting silver oxide on this mixture and thereby dissolving it.

8. The organic silver composition according to claim 1, wherein a single organic compound or a mixture of one or more compounds as selected from the group consisting of carbonate-based compounds is used.

9. An ink composition, wherein it is composed of the organic silver composition manufactured according to claim 8, an organic solvent and a surfactant.

10. A method for manufacturing an organic silver composition by mixing one or more compounds selected from the group consisting of amine-based compounds with the organic compound according to claim 8, then reacting silver oxide on this mixture and thereby dissolving it.

11. The organic silver composition according to claim 1, wherein it is composed of 20~85 wt. % of amine-based compound, 10~20 wt. % of organic compound forming organic silver by reacting on silver oxide and 5~40 wt. % of silver oxide.

12. An ink composition, wherein it is composed of the organic silver composition manufactured according to claim 11, an organic solvent and a surfactant.

13. An ink composition, wherein it is composed of the organic silver composition manufactured according to claim 1, an organic solvent and a surfactant.

14. The ink composition according to claim 13, wherein it is composed of 10~90 wt. % of the organic silver composition, 9.9~85 wt. % of the organic solvent and 0.1~10 wt. % of the surfactant.

15. A method for forming a conductive circuit by spreading a conductive ink through an inkjet method, wherein the ink is composed of an organic silver composition, an organic solvent and a surfactant, and the organic silver composition is manufactured by reacting silver oxide on a mixture of one or more compounds selected from the group consisting of amine-based compounds with one or more compounds selected from the group consisting of organic compounds forming organic silver by reacting on silver oxide, and thereby dissolving it, wherein said organic compounds are selected from the group consisting of lactone-based compounds, lactam-based compounds, and carbonate-based compounds.

16. A method for manufacturing an organic silver composition by mixing one or more compounds selected from the group consisting of amine-based compounds with one or more compounds selected from the group consisting of organic compounds forming organic silver by reacting on silver oxide, then reacting silver oxide on this mixture and thereby dissolving it, wherein a single organic compound or a mixture of one or more compounds as selected from the group consisting of cyclic acid anhydride-based compounds is used.

17. A method for manufacturing an organic silver composition by mixing one or more compounds selected from the group consisting of amine-based compounds with one or more compounds selected from the group consisting of organic compounds forming organic silver by reacting on silver oxide, then reacting silver oxide on this mixture and thereby dissolving it, wherein said organic silver composition is composed of 20~85 wt. % of amine-based compound, 10~20 wt. % of organic compound forming organic silver by reacting on silver oxide and 5~40 wt. % of silver oxide.

* * * * *